(12) United States Patent
Furukawa et al.

(10) Patent No.: US 9,583,577 B2
(45) Date of Patent: Feb. 28, 2017

(54) SEMICONDUCTOR DEVICE AND MANUFACTURING METHOD THEREOF (71) Applicant: KABUSHIKI KAISHA TOSHIBA, Tokyo (JP)

(72) Inventors: Chisato Furukawa, Komatsu Ishikawa (JP); Masaaki Ogawa, Sagamihara Kanagawa (JP); Takako Motai, Yokohama Kanagawa (JP); Wakana Nishiwaki, Kawasaki Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/840,732

(22) Filed: Aug. 31, 2015

(65) Prior Publication Data
US 2016/0268380 A1 Sep. 15, 2016

(30) Foreign Application Priority Data
Mar. 13, 2015 (JP) .................................. 2015-051489

(51) Int. Cl.
| H01L 29/32 | (2006.01) |
| H01L 29/778 | (2006.01) |
| H01L 29/66 | (2006.01) |
| H01L 29/06 | (2006.01) |
| H01L 29/40 | (2006.01) |
| H01L 29/417 | (2006.01) |
| H01L 29/20 | (2006.01) |

(52) U.S. Cl.
CPC .......... *H01L 29/32* (2013.01); *H01L 29/0653* (2013.01); *H01L 29/66462* (2013.01); *H01L 29/7787* (2013.01); *H01L 29/2003* (2013.01); *H01L 29/402* (2013.01); *H01L 29/41758* (2013.01)

(58) Field of Classification Search
CPC H01L 29/66462; H01L 29/7787; H01L 29/32
See application file for complete search history.

(56) References Cited

U.S. PATENT DOCUMENTS 6,682,991 B1 * 1/2004 Hino ................... H01L 21/0332
257/E21.035

FOREIGN PATENT DOCUMENTS

| JP | 2005-020027 A | 1/2005 |
| JP | 5060055 B2 | 10/2012 |
| JP | 2014-003056 A | 1/2014 |
| JP | 2014-063861 A | 4/2014 |

* cited by examiner

*Primary Examiner* — Amar Movva
(74) *Attorney, Agent, or Firm* — Patterson & Sheridan, LLP

(57) ABSTRACT

A semiconductor device includes a substrate, a first nitride semiconductor layer on the substrate, a second nitride semiconductor layer on the first nitride semiconductor layer, a third nitride semiconductor layer on the second nitride semiconductor layer, an electrode on the third nitride semiconductor layer, and an insulating layer under the electrode and between the first nitride semiconductor layer and the second nitride semiconductor layer.

6 Claims, 13 Drawing Sheets

SEMICONDUCTOR DEVICE AND MANUFACTURING METHOD THEREOF

CROSS-REFERENCE TO RELATED APPLICATION

This application is based upon and claims the benefit of priority from Japanese Patent Application No. 2015-051489, filed Mar. 13, 2015, the entire contents of which are incorporated herein by reference.

FIELD

Embodiments described herein relate generally to a semiconductor device and the manufacturing method thereof.

BACKGROUND

In some types of semiconductor devices such as High Electron Mobility Transistors (HEMTs), a nitride semiconductor layer grown on a substrate is used in some cases as a semiconductor layer of the device.

However, when the nitride semiconductor layer is grown on the substrate, a residual stress (for example, tensile stress) is created in the nitride semiconductor layer because of a difference of the coefficients of thermal expansion, and a mismatch between the lattice constants of, the nitride semiconductor layer and the substrate on which it is grown. In a nitride semiconductor layer having this residual stress, there is a possibility of defect generation. When the defect exists, even when the HEMT is controlled so that it should be in the off state, occasionally there occurs a leakage current between the source and drain thereof.

DETAILED DESCRIPTION

In general, according to one embodiment, a semiconductor device includes a substrate, a first nitride semiconductor layer on the substrate, a second nitride semiconductor layer on the first nitride semiconductor layer, a third nitride semiconductor layer on the second nitride semiconductor layer, an electrode on the third nitride semiconductor layer, and an insulating layer under the electrode and between the first nitride semiconductor layer and the second nitride semiconductor layer.

Hereinafter, preferred embodiments will be described with reference to the drawings. In the following description, the same reference numerals and letters are attached to the same materials and the repeated description of the same elements is properly omitted.

(First Embodiment)

Figure 1A:
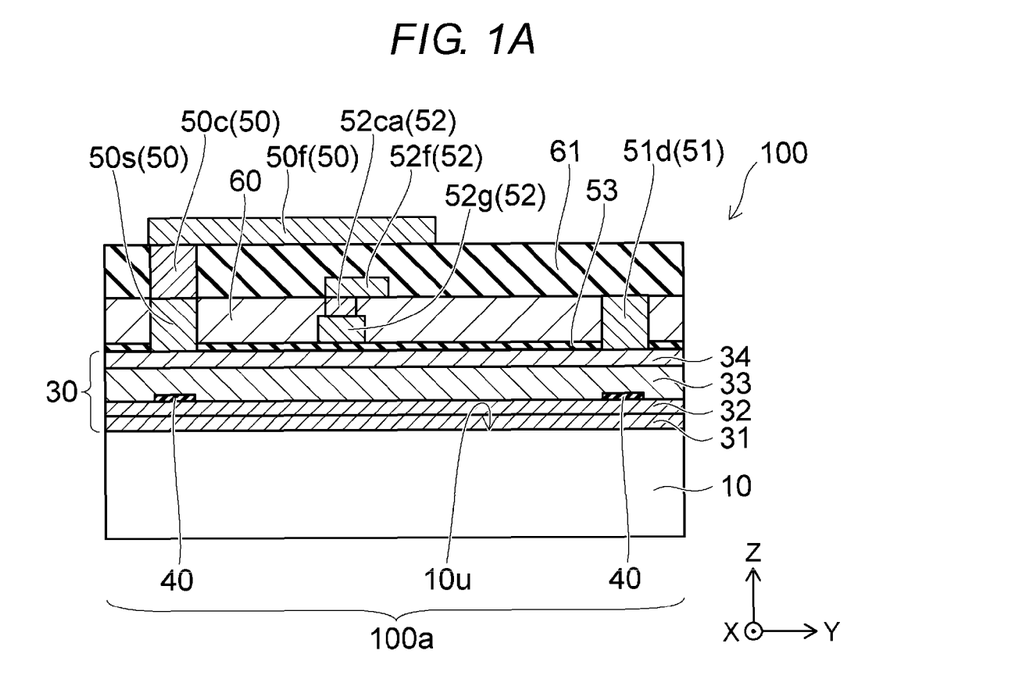
FIG. 1A is a schematic cross-sectional view illustrating a main portion of a semiconductor device at section A1-A2 of FIG. 2 according to a first embodiment.
Figure 1B:
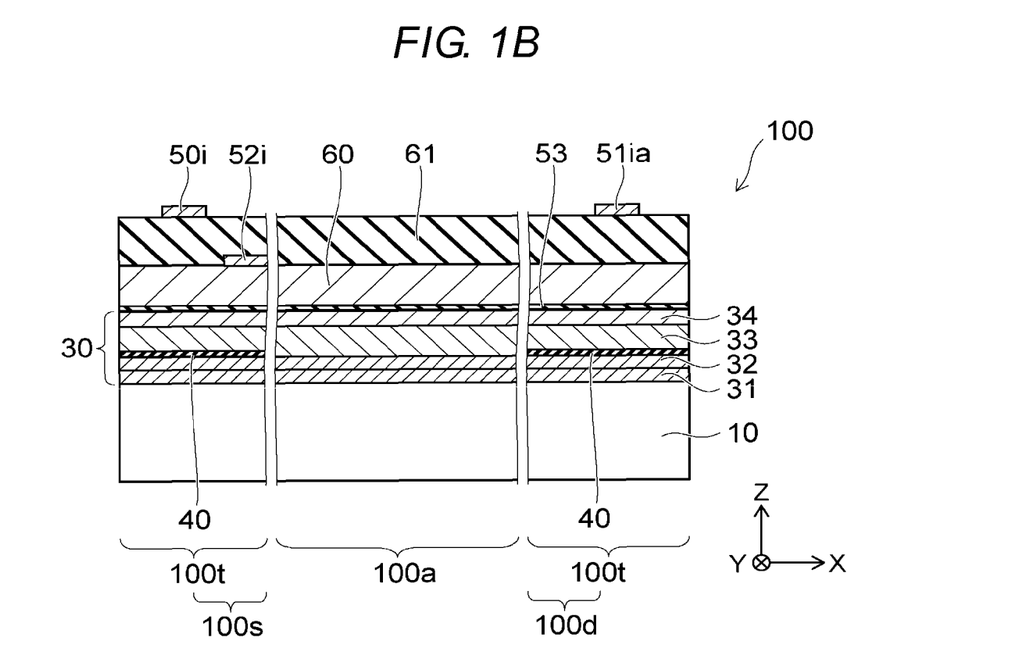
FIG. 1B is a schematic cross-sectional view illustrating the main portion of the semiconductor device at section B1-B2 of FIG. 2 according to the first embodiment.
Figure 2:
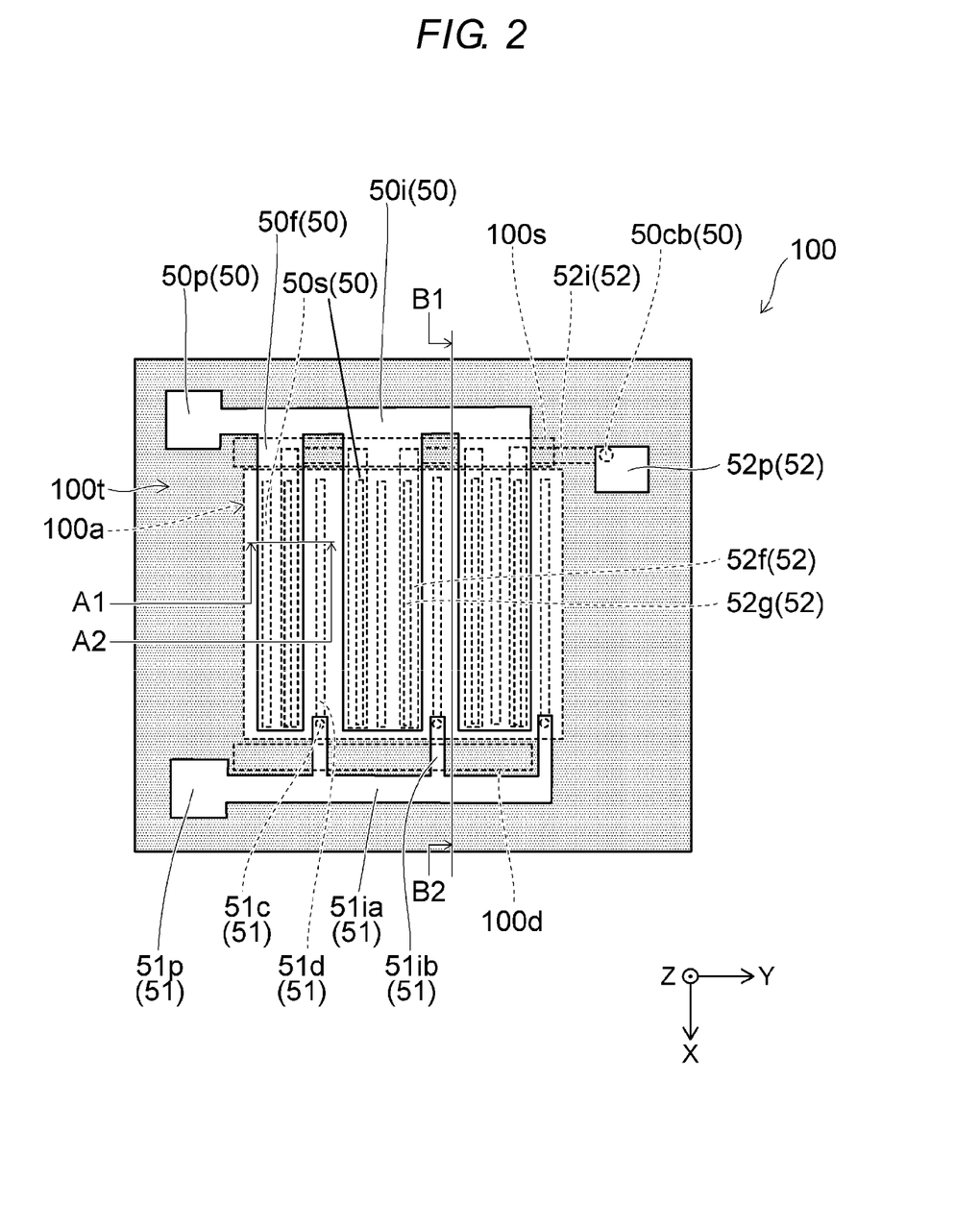
FIG. 2 is a schematic plan view illustrating the main portion of the semiconductor device according to the first embodiment.

FIG. 1A is a schematic cross-sectional view illustrating a main portion of a semiconductor device at section A1-A2 of FIG. 2 according to a first embodiment. FIG. 1B is a schematic cross-sectional view illustrating the main portion of the semiconductor device at section B1-B2 of FIG. 2 according to the first embodiment.

FIG. 2 is a schematic plan view illustrating the main portion of the semiconductor device according to the first embodiment.

In the following drawings, a three dimensional coordinate system is used. Here, the X axis, the Y axis, and the Z axis intersect each other. For example, the X axis, Y axis, and Z axis are orthogonal to each other.

As a semiconductor device 100 according to the first embodiment, a High Electron Mobility Transistor (HEMT) is shown as an example.

The semiconductor device 100 includes, for example, a substrate 10, a first nitride semiconductor layer (hereinafter, referred to as a first buffer layer 31 and a second buffer layer 32), a second nitride semiconductor layer (hereinafter, for example, a channel layer 33), a third nitride semiconductor layer (hereinafter, for example, a barrier layer 34), an electrode (hereinafter, for example, a first electrode 50, a second electrode 51, and a third electrode 52), a gate insulating film 53, an insulating layer 40, a protective layer 60, and an interlayer insulating layer 61. In the drawings of the embodiment, the direction extending from the substrate 10 to the barrier layer 34 is defined as a first direction (Z direction) and directions intersecting the first direction is defined as a second direction (Y direction) and a third direction (X direction). The Y direction and the X direction intersect each other.

The substrate 10 comprises, for example, silicon (Si). The material of the substrate 10 is not restricted to silicon but also may be sapphire e, diamond, silicon carbide, carbon, nitride semiconductor, boron nitride, or germanium. In the embodiment, a silicon substrate is used, by way of example, as the substrate 10. When the substrate 10 is silicon, the upper surface 10u thereof is, for example, the (111) surface.

The first buffer layer 31 is located on the substrate 10. The first buffer layer 31 includes aluminum nitride. The second buffer layer 32 is located on the first buffer layer 31. The second buffer layer 32 includes gallium aluminum nitride.

The channel layer 33 is located on the second buffer layer 32. The channel layer 33 includes undoped gallium nitride (GaN), or undoped gallium aluminum nitride (AlxGa$_{1-x}$N where 0≤X<1). The carrier transport layer 33 may include one of Ga$_x$In$_{1-x}$N$_y$As$_{1-y}$ where 0≤x≤1, 0≤y≤1, Al$_x$In$_y$Ga$_{1-x-y}$N where 0≤x≤1, 0≤y≤1, and B$_x$In$_{1-x}$N where (0≤x≤1).

The barrier layer 34 is located on the channel layer 33. The barrier layer 34 includes undoped or n-type gallium aluminum nitride (Al$_y$Ga$_{1-y}$N where 0<Y≤1, X<Y). Further, the barrier layer 34 may include one of Ga$_x$In$_{1-x}$N$_y$As$_{1-y}$ where 0≤x≤1, 0≤y≤1, Al$_x$In$_y$Ga$_{1-x-y}$N where 0≤x≤1, 0≤y≤1, and B$_x$In$_{1-x}$N where 0≤x≤1.

A two dimensional electron (2DEG) gas is created within the channel layer 33 in the vicinity of the boundary of the channel layer 33 and the barrier layer 34. In the embodiment, the first buffer layer 31, the second buffer layer 32, the channel layer 33, and the barrier layer 34 are stacked as a stack body 30.

The first electrode 50 includes a first electrode (hereinafter, for example, a source wiring 50i), a second electrode (hereinafter, for example, a source electrode 50s), a contact electrode 50c, a field plate electrode 50f, and a source pad electrode 50p (FIG. 2). The source electrode 50s is provided on and in contact with the barrier layer 34.

As shown in FIG. 2, a plurality of the source electrodes 50s are provided in the semiconductor device 100 spaced in the Y direction and extending in the X direction. The source electrodes 50s are electrically connected to the barrier layer 34. Each of the source electrodes 50s forms an ohmic contact with the barrier layer 34. Each source electrode 50s is connected to a field plate electrode 50f through a contact electrode 50c. Each field plate electrode 50f is commonly connected to a source wiring 50i (FIGS. 1B and 2). The field plate electrode 50f and the source wiring 50i are located on, for example, an interlayer insulating layer 61.

The source wiring 50i extends in the Y direction. The source wiring 50i is electrically connected to the source electrode 50s through the field plate electrodes 50f and the contact electrodes 50c. The source pad electrode 50p is connected to the source wiring 50i.

The second electrode 51 has a portion thereof spaced from the first electrode 50 in the Y direction. For example, the second electrode 51 includes a third electrode portion (hereinafter, for example, a drain wiring 51ia), a fourth electrode portion (hereinafter, for example, individual drain electrodes 51d), individual drain wirings 51ib, individual contact electrodes 51c connecting the drain electrodes to the drain wiring 51ia through the drain wirings 51ib, and a drain pad electrode 51p. The second electrode 51 is provided on the barrier layer 34. A plurality of the second electrodes 51 are provided and spaced from one another in the Y direction.

Each drain electrode 51d is in ohmic contact with the barrier layer 34. The drain electrodes 51d are also respectively spaced from the source electrodes 50s in the Y direction and extend in the X direction.

The drain wiring 51ia is provided on, for example, the interlayer insulating layer 61. The drain wiring 51ia extends in the Y direction. The drain wiring 51ia is electrically connected to the drain electrode 51d through the drain wiring 51ib and the contact electrode 51c. The drain pad electrode 51p (FIG. 2) is connected to the drain wiring 51ia.

The source electrodes 50s and the drain electrodes 51d are provided between the locations of the source wiring 50i and the drain wiring 51ia in the X direction. The source electrodes 50s and the drain electrodes 51d extend in the X direction on the barrier layer 34.

The gate insulating film 53 is provided on the barrier layer 34. The gate insulating film 53 includes at least one of silicon nitride (Si$_3$N$_4$), silicon oxide film (SiO$_2$), aluminum oxide (Al$_2$O$_3$).

The third electrode 52 is located between the first electrode 50 and the second electrode 51. For example, the third electrode 52 includes a fifth electrode portion (hereinafter, for example, a gate wiring 52i), a plurality of sixth electrode portions (hereinafter, for example, individual gate electrodes 52g), contact electrodes 52ca and 52cb, field plate electrodes 52f, and a gate pad electrode 52p (FIG. 2). The gate electrodes 52g are located over the barrier layer 34 with the gate insulating film 53 extending therebetween.

Each gate electrode 52g is located between a source electrode 50s and a drain electrode 51d in the Y direction and it extends in the X direction of the device. Each field plate electrode 52f extends on the protective layer 60 in the Y-direction from a gate electrode 52g in the direction of a drain electrode 51d. The gate wiring 52i is electrically connected to the gate electrodes 52g through the field plate electrodes 52f and the contact electrodes 52ca. The gate pad electrode 52p is electrically connected to the gate wiring 52i through the contact electrode 52cb.

The number of the source electrodes 50s, the drain electrodes 51d, and the gate electrodes 52g is not restricted to the illustrated number shown in FIG. 2.

The insulating layer 40 is selectively located over a portion of the second buffer layer 32, between the second buffer layer 32 and the channel layer 33. The insulating layer 40 comprises at least any of silicon oxide (SiO$_x$), silicon nitride (SiN$_x$), alumina (Al$_x$O$_y$), zirconia (ZrO$_x$), and resist.

For example, as illustrated in FIG. 1A, an insulating layer 40 is located under the source electrode 50s and/or under the drain electrode 51d.

In the semiconductor device 100, a region where the source electrodes 50s, the drain electrodes 51d, and the gate electrodes 52g are located is defined as an element region 100a. As viewed in FIG. 2, an area surrounding the element region 100a is defined as a termination region 100t. The insulating layer 40 is also present in the termination region 100t.

In the termination region 100t, the insulating layer 40 is provided at least under a portion of the source wiring 50i, the drain wiring 51ia, and the gate wiring 52i. Alternatively, the insulating layer 40 is provided in at least any of a region 100s between the source wiring 50i and the drain electrode 51d and a region 100d between the drain wiring 51ia and the source electrode 50s.

The protective layer 60 is located on the gate insulating film 53. The protective layer 60 includes, for example, silicon nitride. The interlayer insulating layer 61 is located on the protective layer 60. The interlayer insulating layer 61 comprises, for example, silicon oxide (SiO$_x$).

A manufacturing process for the semiconductor device 100 will now be described.

Figure 3A:
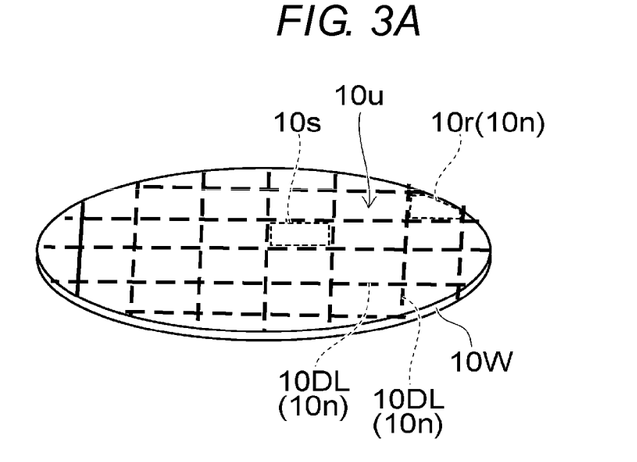
FIGS. 3A to 3C are schematic perspective views illustrating a manufacturing process of the main portion of the semiconductor device according to the first embodiment.
Figure 3B:
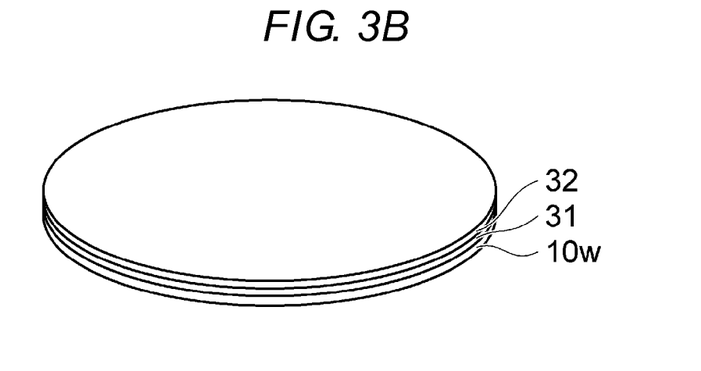
Figure 3C:
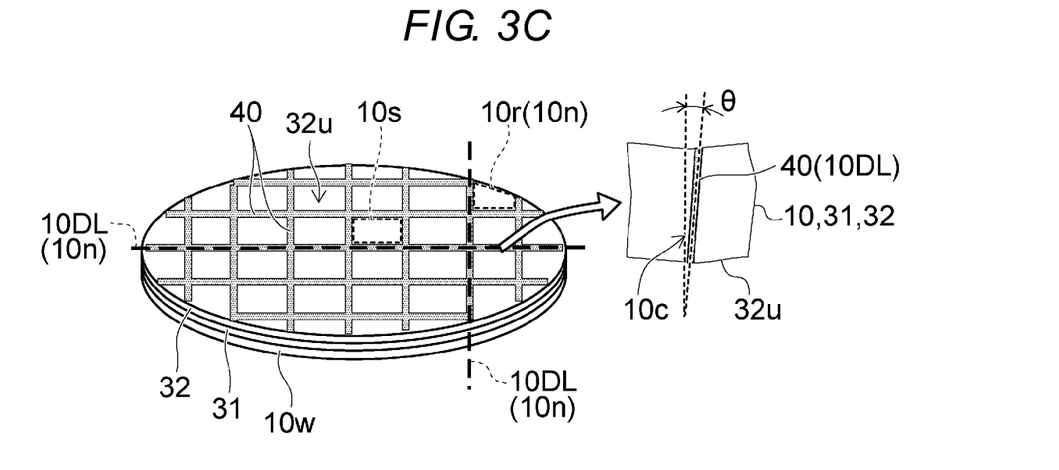

FIGS. 3A to 3C are schematic perspective views illustrating the manufacturing process of a main portion of the semiconductor device according to the first embodiment.

For example, a wafer shaped substrate 10W illustrated in FIG. 3A includes a first region that becomes the substrate 10 of the semiconductor device 100 (hereinafter, for example, a chip region 10s) and a second region outside the chip region 10s (hereinafter, for example, unused region 10n). The substrate 10W is, for example, a silicon wafer and, for example, the (111) surface is exposed as the upper surface 10u thereof.

The unused region 10n includes, for example, a dicing region 10DL and a peripheral region 10r that is not the resulting device portion of the substrate 10 nor the dicing region 10DL.

Next, as illustrated in FIG. 3B, the first buffer layer 31 and the second buffer layer 32 are formed on the upper surface 10u of the wafer shaped substrate 10W in that order.

Next, as illustrated in FIG. 3C, the insulating layer 40 is selectively formed on the substrate 10W in the dicing region 10DL over the buffer layers 31 and 32. For example, after the insulating layer 40 is formed on the entire surface of the second buffer layer 32, the insulating layer 40 is selectively formed on the second buffer layer 32, for example, by depositing a film layer for the insulating layer, selectively masking that layer, and performing Reactive Ion Etching (RIE) on the exposed portions of the insulating layer 40. Hereinafter, this blanket film formation, masking, and RIE are used for the selective formation of the layer and the electrode. According to this, the insulating layer 40 is formed, for example, in a lattice shape.

Here, at the right hand side of FIG. 3C, a magnified view of the upper surface 32u of the second buffer layer 32 is illustrated. The insulating layer 40 extends along the surface of the buffer layers 31 and 32 in a manner such that the direction of the insulating layer 40 is not parallel to a cleavage plane 10c along the surface of the substrate 10W. For example, an angle θ made by the line 10c and the extending direction of the insulating layer 40 is set as 5° and more, up to 90°.

Then, in the first embodiment, the channel layer 33 is formed on the second buffer layer 32 and the insulating layer 40 and the barrier layer 34 are formed on the channel layer 33.

In the first embodiment, when the insulating layer 40 is formed in the dicing region 10DL, the insulating layer 40 is patterned also in the chip region 10s. Hereinafter, the manufacturing process in the chip region 10s will be described.

FIGS. 4A to 10B are schematic cross-sectional views illustrating the manufacturing process of the main portion of the semiconductor device in the chip region of the first embodiment.

In FIGS. 4A to 10B, figure A of each figure corresponds to the cross section taken along the above line A1-A2 of FIG. 2 and figure B of each figure corresponds to the cross section taken along the above line B1-B2 of FIG. 2.

Figure 4A:
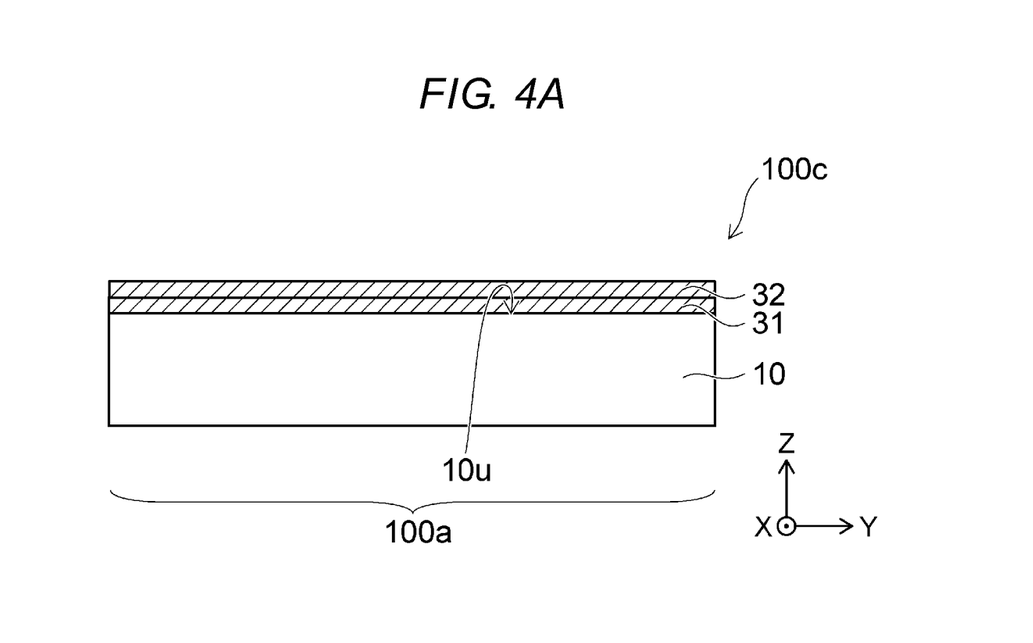
FIGS. 4A and 4B are schematic cross-sectional views illustrating the manufacturing process of the main portion of the semiconductor device according to a chip region of the first embodiment.
Figure 4B:
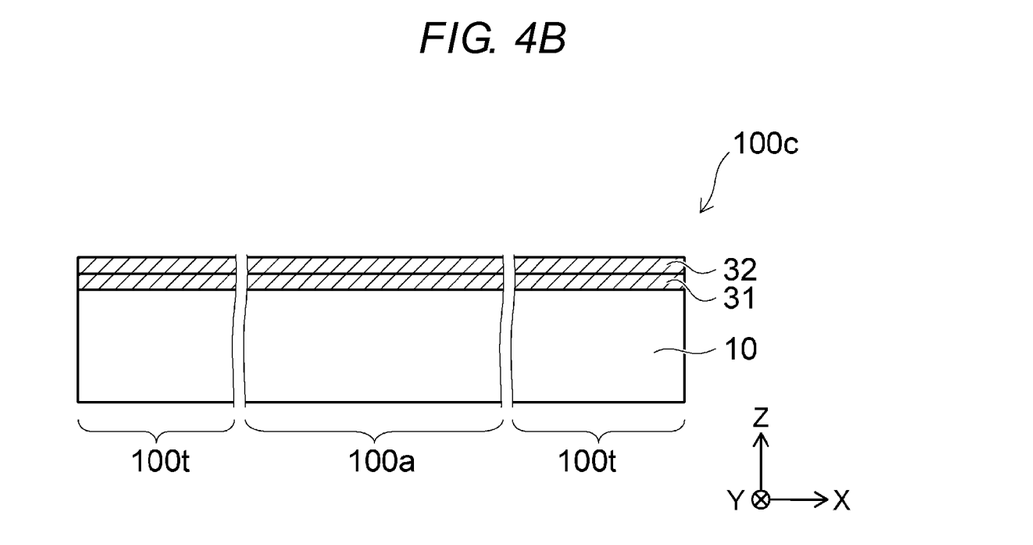

For example, as illustrated in FIGS. 4A and 4B, the first buffer layer 31 and the second buffer layer 32 are formed on the substrate 10 in that order.

Figure 5A:
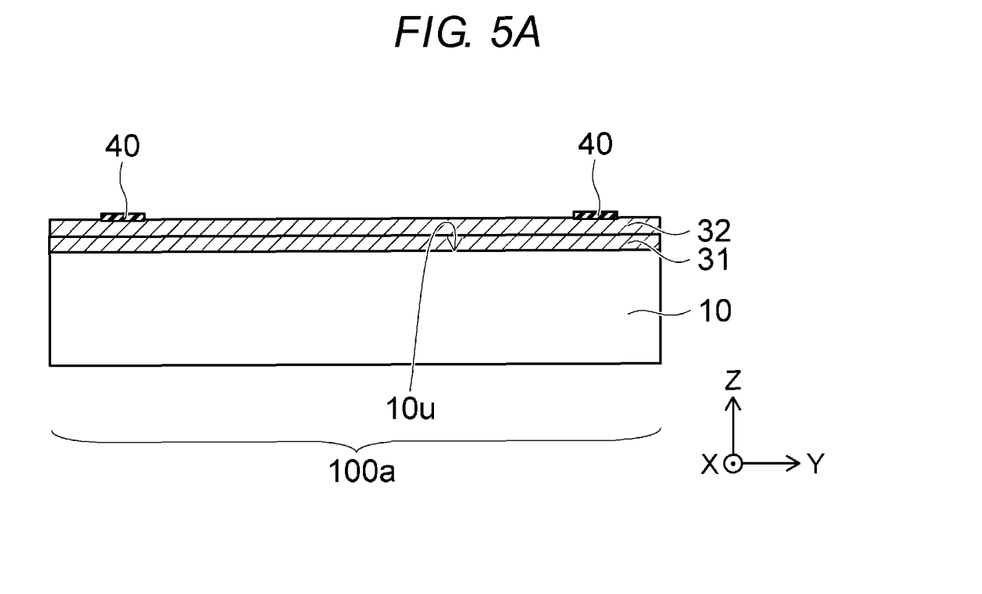
FIGS. 5A and 5B are schematic cross-sectional views illustrating the manufacturing process of the main portion of the semiconductor device according to the chip region of the first embodiment.
Figure 5B:
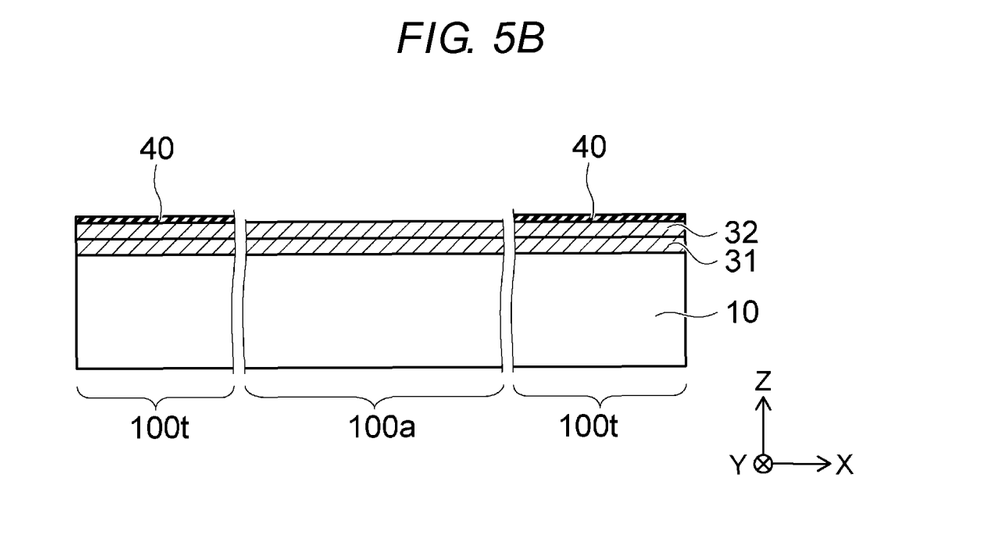

Next, as illustrated in FIGS. 5A and 5B, the insulating layer 40 is selectively formed on the second buffer layer 32.

The insulating layer 40 is formed in a region where the source electrode 50s and the drain electrode 51d are formed in the element region 100a (FIG. 5A). Further, the insulating layer 40 is also formed in the terminating region 100t surrounding the element region 100a (FIG. 5B).

Figure 6A:
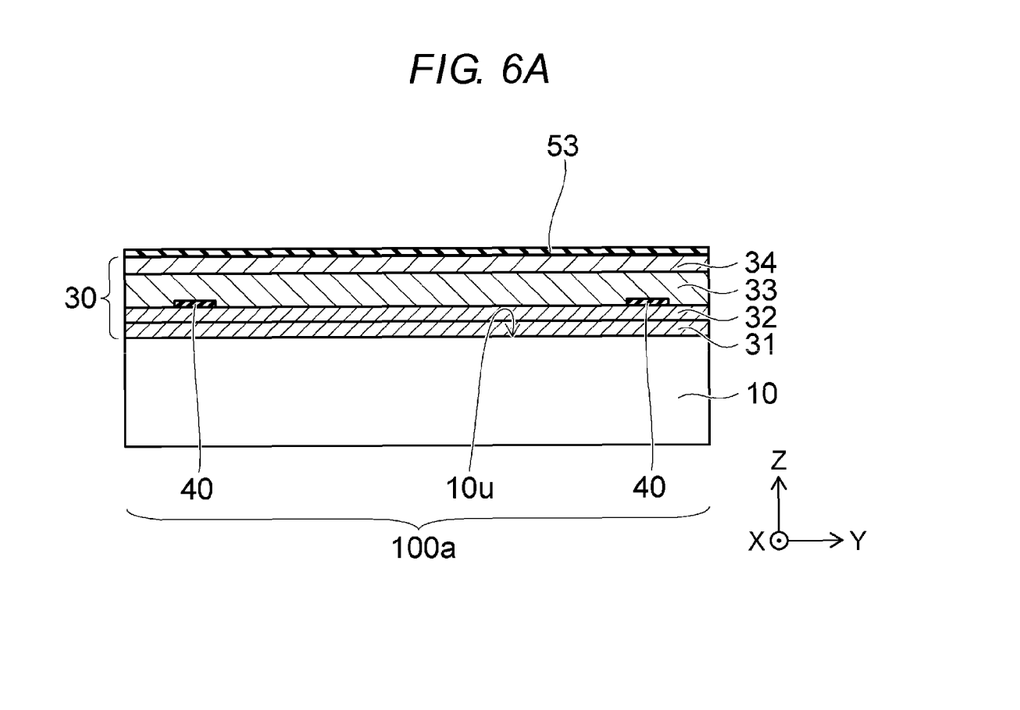
FIGS. 6A and 6B are schematic cross-sectional views illustrating the manufacturing process of the main portion of the semiconductor device according to the chip region of the first embodiment.
Figure 6B:
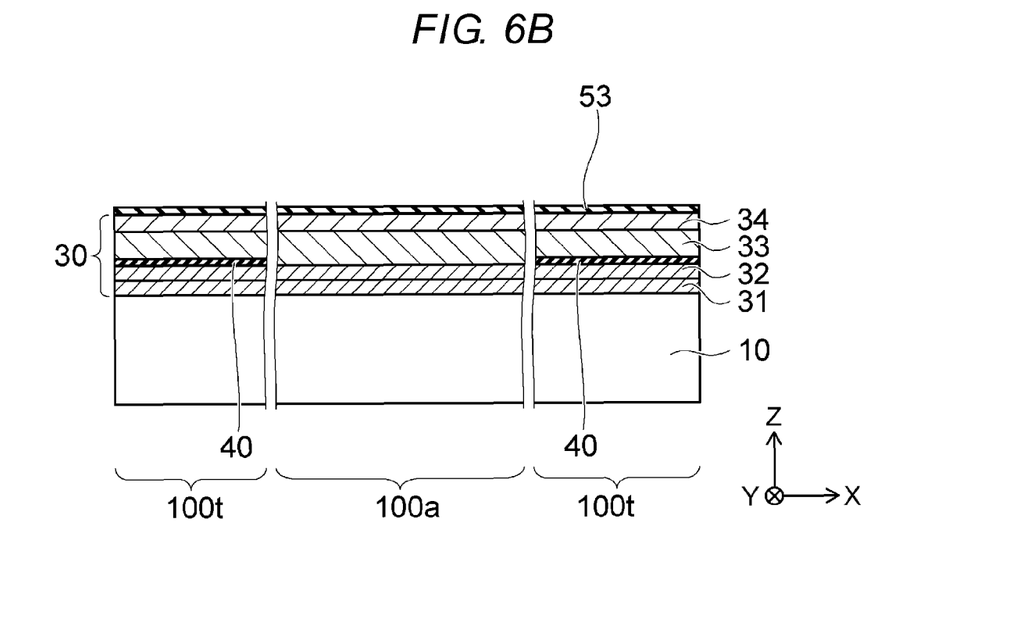

As illustrated in FIGS. 6A and 6B, the channel layer 33 is formed on the second buffer layer 32 and the insulating layer 40. The barrier layer 34 is formed on the channel layer 33.

The channel layer 33 and the barrier layer 34 are formed, for example, using Metal Organic Chemical Vapor Deposition (MOCVD). Further, the gate insulating film 53 is formed on the barrier layer 34.

Figure 7A:
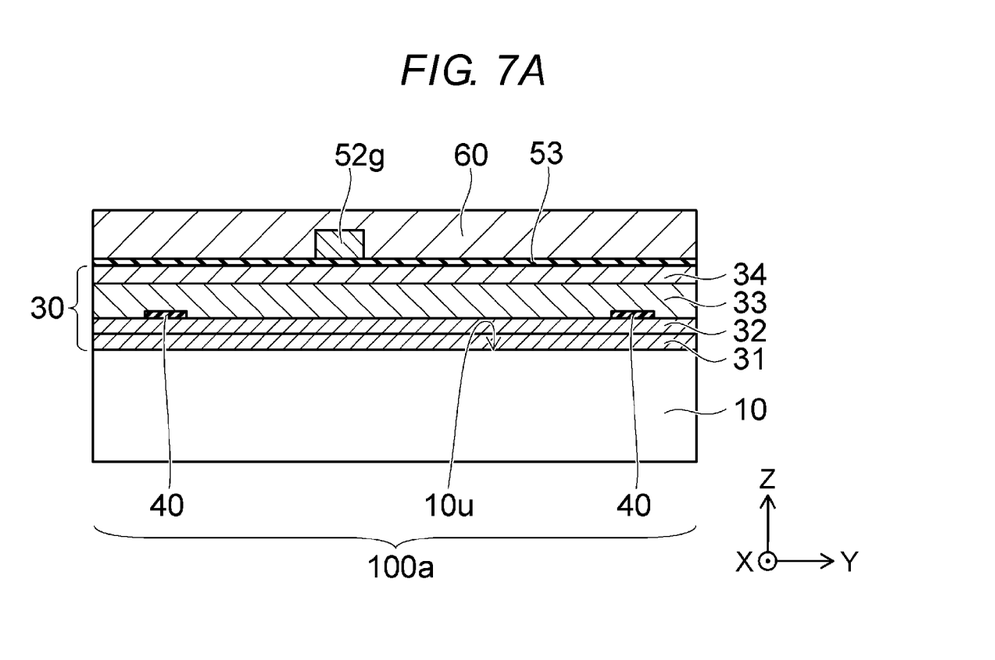
FIGS. 7A and 7B are schematic cross-sectional views illustrating the manufacturing process of the main portion of the semiconductor device according to the chip region of the first embodiment.
Figure 7B:
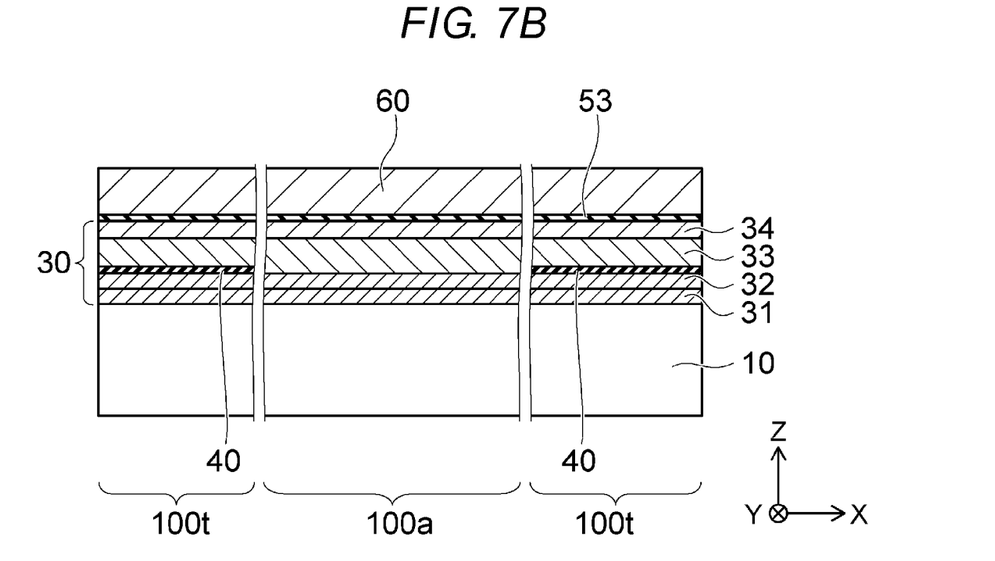

As illustrated in FIGS. 7A and 7B, the gate electrode 52g is selectively formed on the gate insulating film 53 in the element region 100a. Further, the protective layer 60 is formed on the gate insulating film 53 and the gate electrode 52g.

Figure 8A:
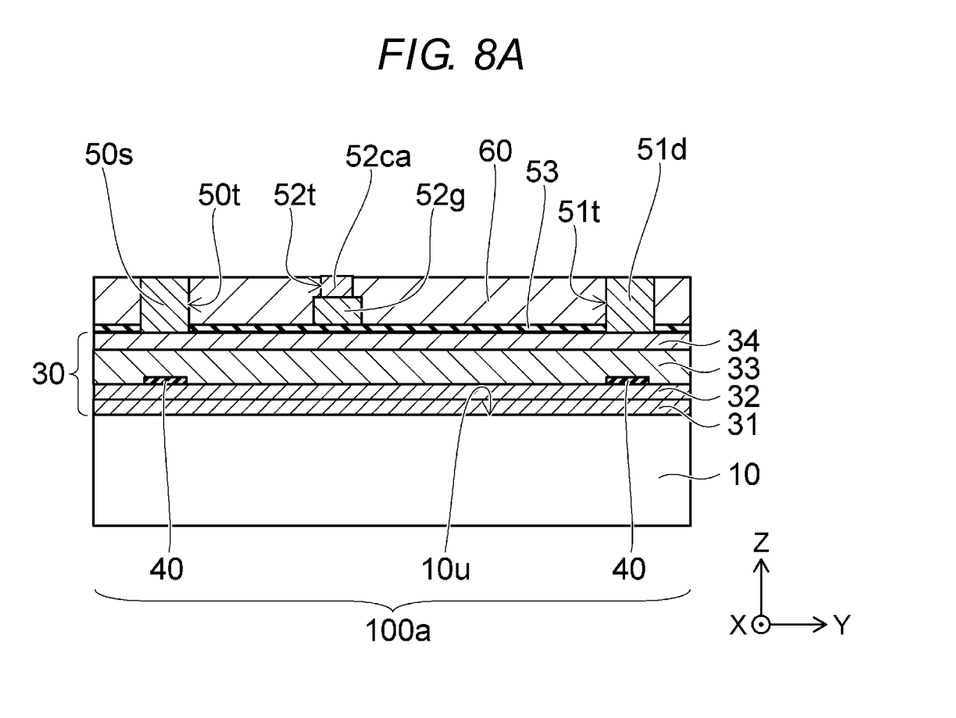
FIGS. 8A and 8B are schematic cross-sectional views illustrating the main portion of the semiconductor device according to the chip region of the first embodiment.
Figure 8B:
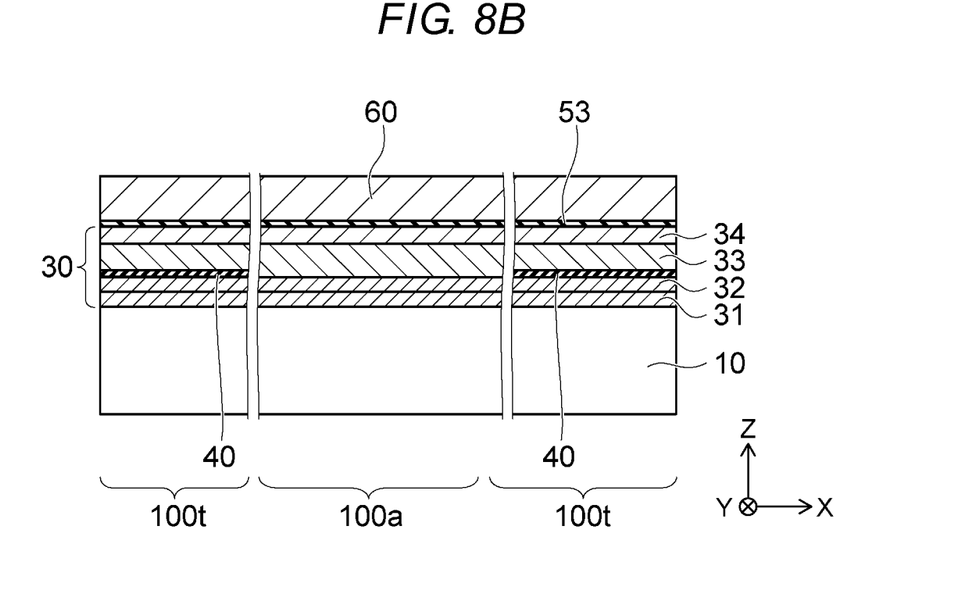

Next, as illustrated in FIGS. 8A and 8B, a trench 50t, a trench 52t, and a trench 51t are formed in the protective layer 60, in the element region 100a, using selective masking and RIE. Further, the source electrode 50s is formed within the trench 50t, the contact electrode 52ca is formed within the trench 52t, and the drain electrode 51d is formed within the trench 51t.

Figure 9A:
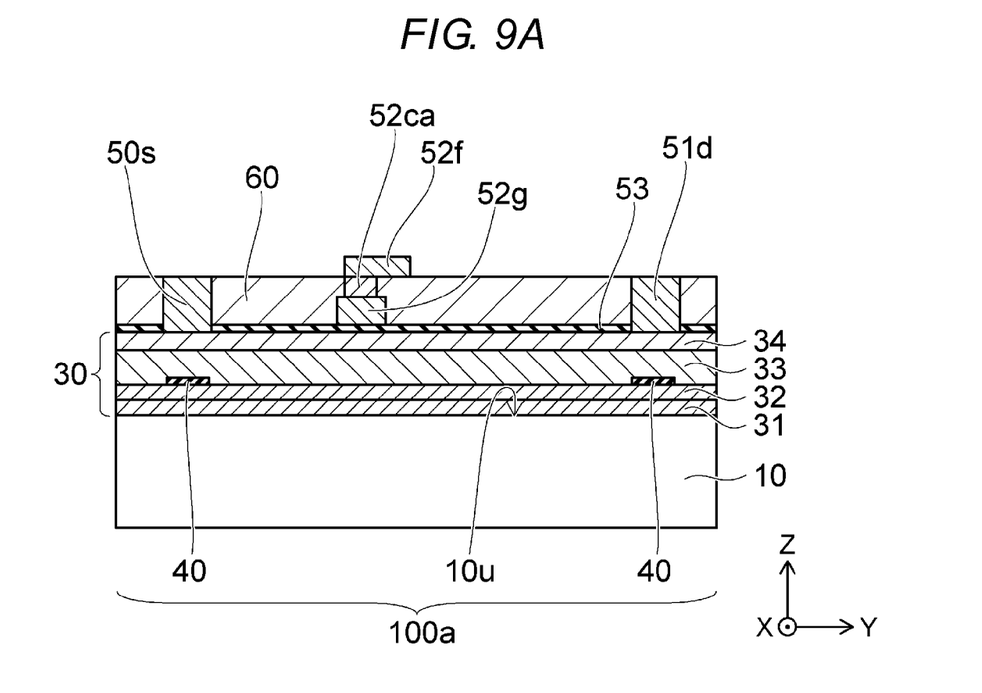
FIGS. 9A and 9B are schematic cross-sectional views illustrating the manufacturing process of the main portion of the semiconductor device according to the chip region of the first embodiment.
Figure 9B:
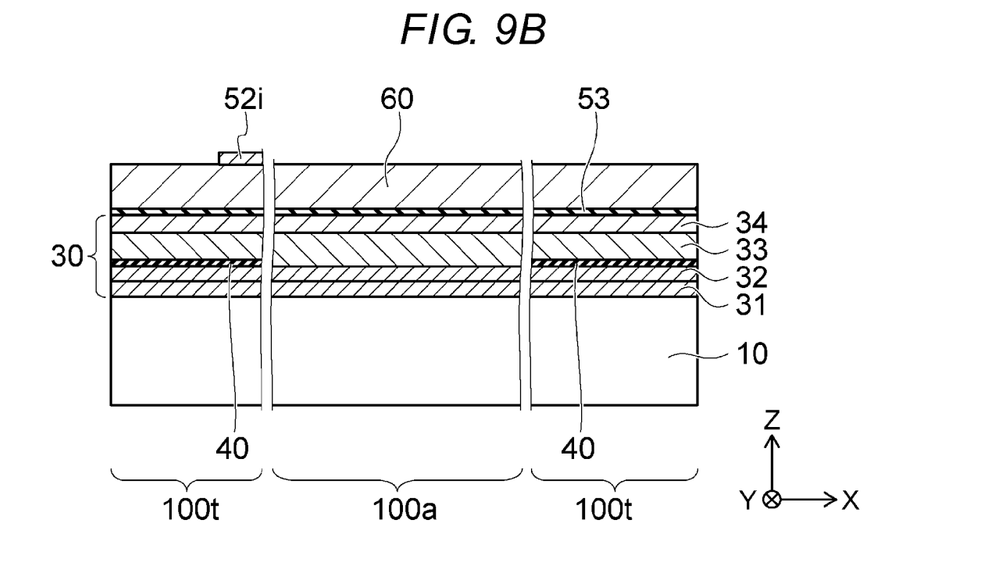

Next, as illustrated in FIGS. 9A and 9B, in the element region 100a, the field plate electrode 52f is formed on the protective layer 60. The field plate electrode 52f is electrically connected to the contact electrode 52ca. Further, in the terminating region 100t, the gate wiring 52i is formed on the protective layer 60. The gate wiring 52i is electrically connected to the field plate electrode 52f.

Figure 10A:
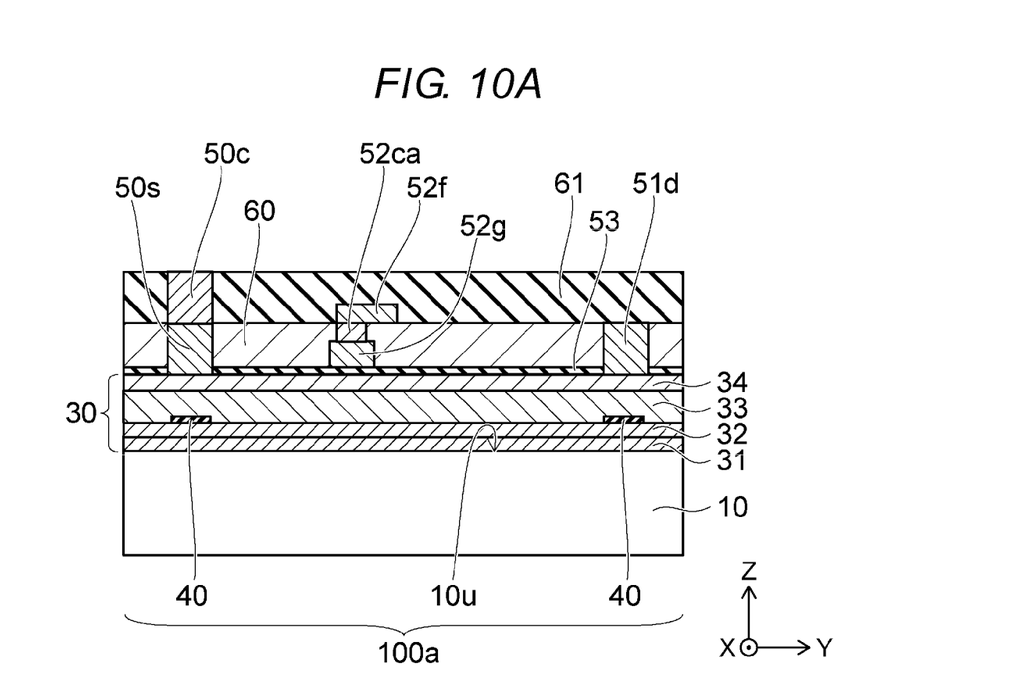
FIGS. 10A and 10B are schematic cross-sectional views illustrating the manufacturing process of the main portion of the semiconductor device according to the chip region of the first embodiment.
Figure 10B:
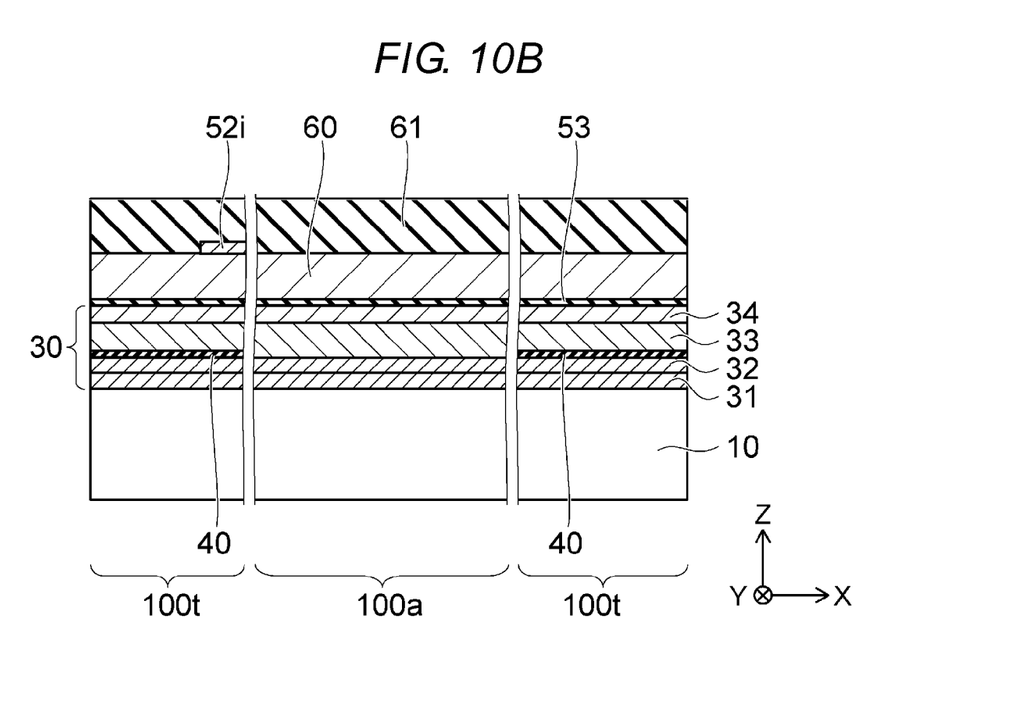

Then, as illustrated in FIGS. 10A and 10B, the interlayer insulating layer 61 is formed on the protective layer 60, the field plate electrode 52f, and the gate wiring 52i.

Then, as illustrated in FIGS. 1A and 1B and FIG. 2, the contact electrode 50c is formed within the interlayer insulating layer 61. The contact electrode 50c is electrically connected to the source electrode 50s. Further, the field plate electrode 50f electrically connected to the contact electrode 50c and the source wiring 50i and source pad electrode 50p electrically connected to the field plate electrode 50f are formed on the interlayer insulating layer 61. The drain wirings 51ia and 51ib and the drain pad electrode 51p electrically connected to the drain electrode 51d are formed on the interlayer insulating layer 61. Further, the gate pad electrode 52p electrically connected to the gate wiring 52i is formed on the interlayer insulating layer 61.

The effect of the first embodiment will now be described.

Figure 11A:
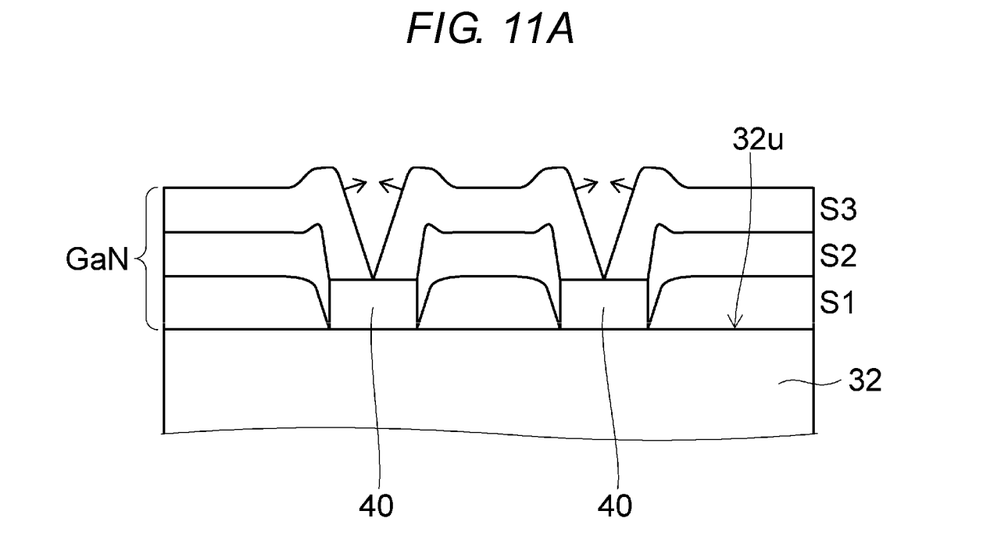
FIGS. 11A and 11B are schematic cross-sectional views for describing the effect of the first embodiment.
Figure 11B:
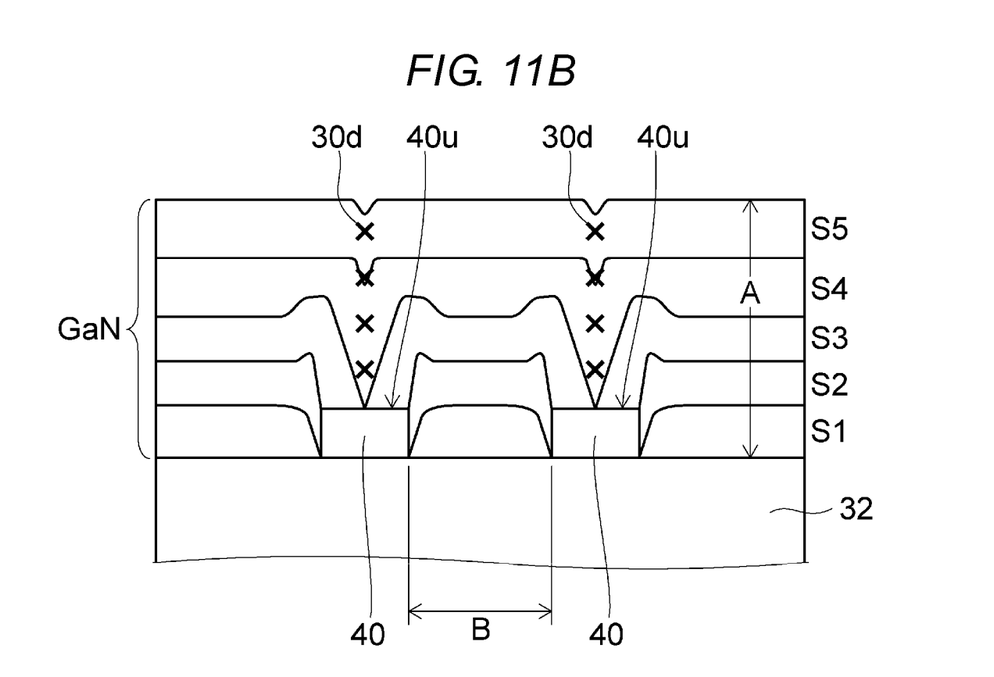

FIGS. 11A and 11B are schematic cross-sectional views for describing the effect of the first embodiment.

In the first embodiment, the insulating layer 40 is previously patterned on the second buffer layer 32, and the channel layer 33 and the barrier layer 34 are formed on the second buffer layer 32 using a Parallel Lateral Epitaxial Overgrowth (PLEG) method or Epitaxial Lateral Overgrowth (ELO) method. In such methods, the epitaxial film growth starts on the second buffer layer 32, and as the epitaxial layer grows, it also extends laterally to cover the insulating layers 40, because epitaxial growth cannot initiate on the non-crystalline insulating layer 40.

FIGS. 11A and 11B illustrate with the growth over time of the nitride semiconductor layer (GaN layer) formed on the second buffer layer 32. Here, the space B in the Y direction between the insulating layers 40 selectively formed on the second buffer layer 32 illustrated in FIG. 11A is, for example, approximately about 10 μm or 10 μm or less. This width is, for example, about the interval between the source electrode 50s and the drain electrode 51d of the HEMT.

In this case, the nitride semiconductor layer is selectively formed on the second buffer layer 32 not covered by the insulating layer 40 in the initial stage S1 of film formation. Here, in the initial stage S1 of the film formation, the nitride semiconductor layer is not formed on the insulating layer 40. In the next stage S2, the nitride semiconductor layer reaches to the upper surface 40u of the insulating layer 40.

Here, when the space between the insulating layers 40 is approximately about 10 μm or 10 μn or less, the growing direction of the nitride semiconductor layer preferentially becomes a horizontal direction in the next stage S3 and thereby begins to extend over the insulating layer 40 as well as to grow upwardly from the buffer layers 31, 32. Here, the horizontal direction includes a direction of proceeding obliquely as indicated by the arrows in FIG. 11A as well as a direction in parallel to the upper surface 32u of the second buffer layer 32.

Further, in the growing nitride semiconductor layer, there are some cases where a defect occurs because of a thermal expansion stress, a tensile strain, and a residual stress in the crystal growth. In the stage S3 and later, however, since the crystal growth proceeds in the horizontal direction, a defect 30d itself included in the nitride semiconductor layer is communicated in the horizontal direction.

As illustrated in FIG. 11B, the nitride semiconductor layers growing from the both sides of the insulating layer 40 come into contact with each other during stage S4. In short, most of the defects 30d occur on the portion where the nitride semiconductor layers growing from the both sides of the insulating layer 40 come into contact with each other, that is, over the insulating layer 40. Further, the tensile strain and the residual stress within the nitride semiconductor layers concentrate in the contacting portions of the growing nitride semiconductor layers. In the next stage S5, the nitride semiconductor layer forming the channel layer 33 is formed on the nitride semiconductor layer as completed in stage S4.

Figure 12A:
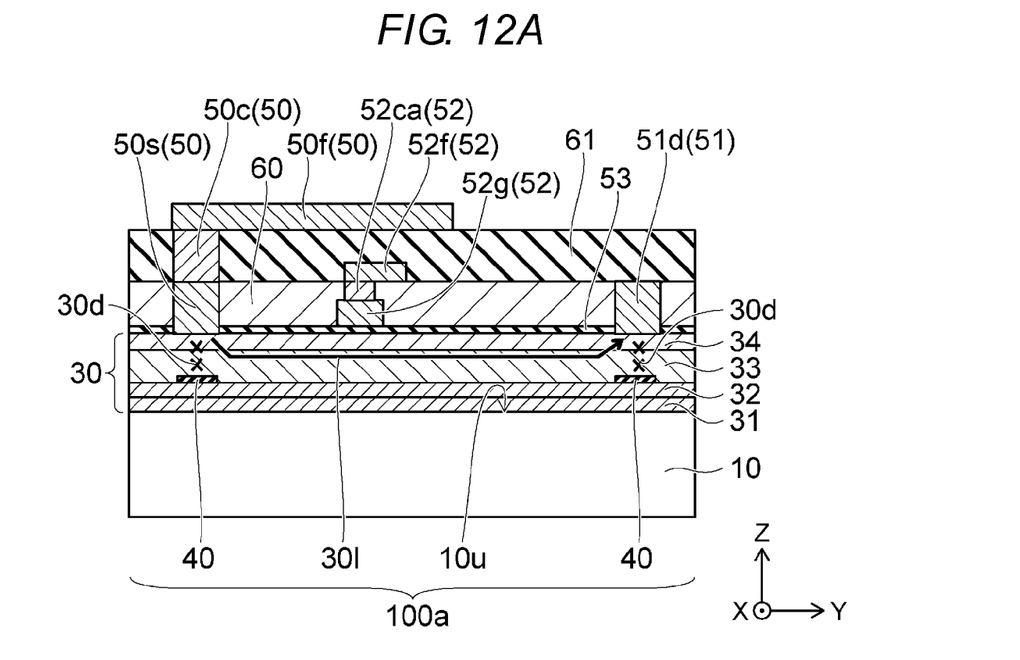
FIGS. 12A and 12B are schematic cross-sectional views for describing the effect of the first embodiment.
Figure 12B:
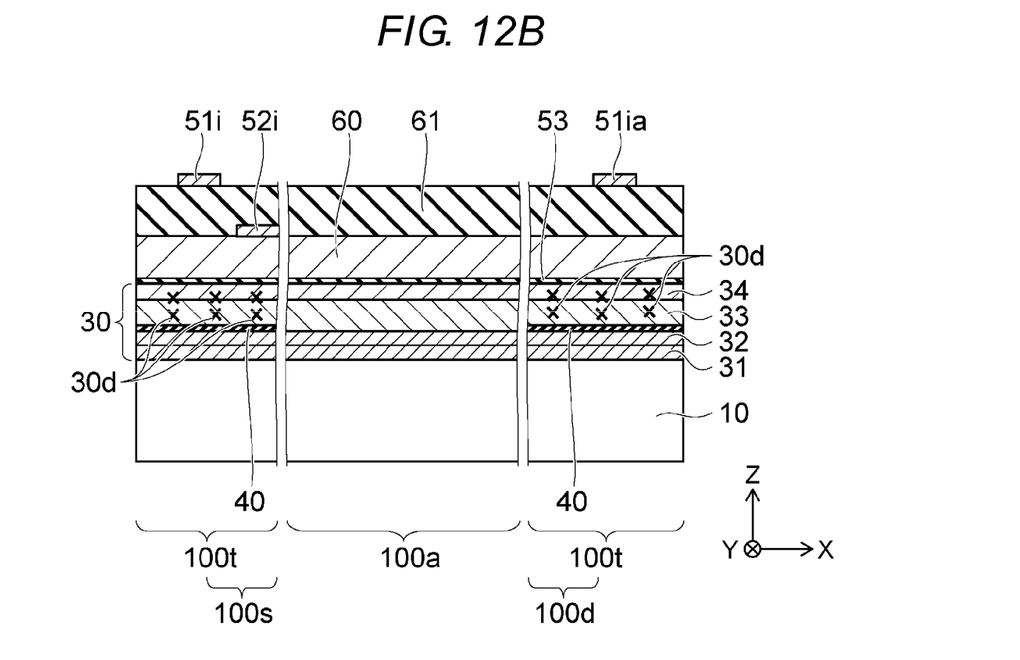

FIGS. 12A and 12B are schematic cross-sectional views for describing the effect of the first embodiment.

FIG. 12A schematically shows a current path between the source electrode 50s and the drain electrode 51d as "30I".

As illustrated in FIG. 12A, most of the defects 30d occur in the portions of the channel layer 33 and the barrier layer 34 overlying the insulating layer 40 in the termination region 100t of the semiconductor device 100. In other words, defect generation is suppressed in the channel layer 33 and the barrier layer 34 between the source electrode 50s and the drain electrode 51d.

If the defect 30d exists in the channel layer 33 or the barrier layer 34 under the gate electrode 52g, even when the bias on the gate electrode 52g is intended to maintain the semiconductor device 100 off, there is a possibility that, for example, leakage current occurs between the source and the drain.

In order to cope with the above, in the semiconductor device 100, the defect generation is suppressed in the current path 30I between the source electrode 50s and the drain electrode 51d and in its vicinity. Accordingly, leakage current is suppressed across the in the current path 30I of the channel.

On the other hand, as illustrated in FIG. 12B, the insulating layer 40 is provided also in the terminating region 100t. Accordingly, most of the defects 30d may occur and the stress may concentrate also in the terminating region 100t outside the element region 100a.

As illustrated in FIG. 3C, the insulating layer 40 is patterned in a manner that the insulating layer 40 is not parallel to the line 10c having easy cleavage of the substrate 10W. Accordingly, stress concentrates in the nitride semi-conductor layer on the insulating layer 40 and even when a crack or a break occurs within the nitride semiconductor layer, the substrate 10W is not, or less frequently, cleaved (cracked) along the line 10c. For example, when the main surface of GaN formed on the substrate 10 is the surface (0, 0, 0, 1), when any of the R surface (1, −1, 0, 0), the M surface (1, 0, −1, 0), and the A surface (1, 1, −2, 0) is in parallel to the line 10c and the GaN crystal is cleaved, the substrate 10W will be cleaved. In the first embodiment, by patterning the insulating layer 40 in a manner that the insulating layer 40 is not parallel to the line 10c, the cleavage of the substrate 10 is suppressed.

(Second Embodiment)

Figure 13A:
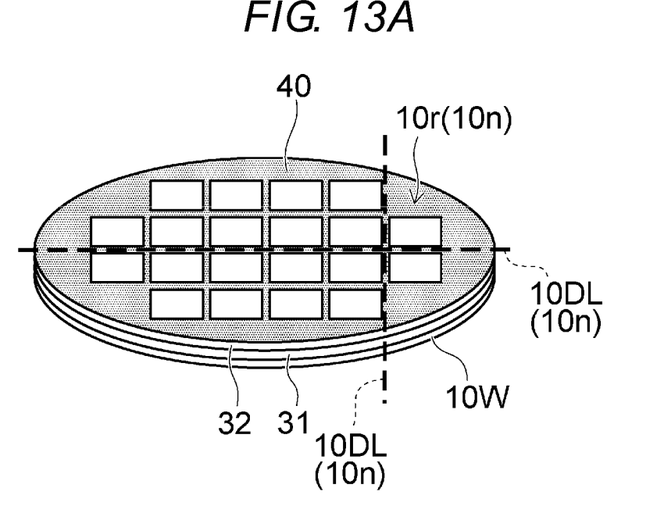
FIGS. 13A to 13C are schematic perspective views illustrating a manufacturing process of a main portion of a semiconductor device according to a second embodiment.
Figure 13B:
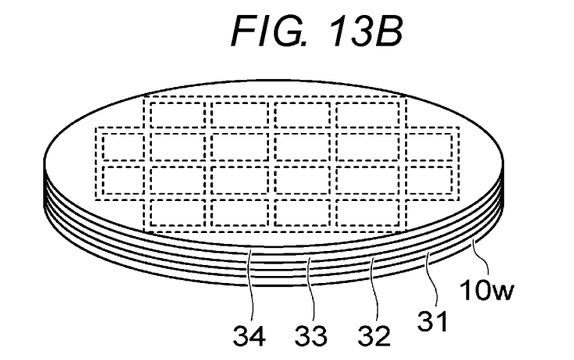
Figure 13C:
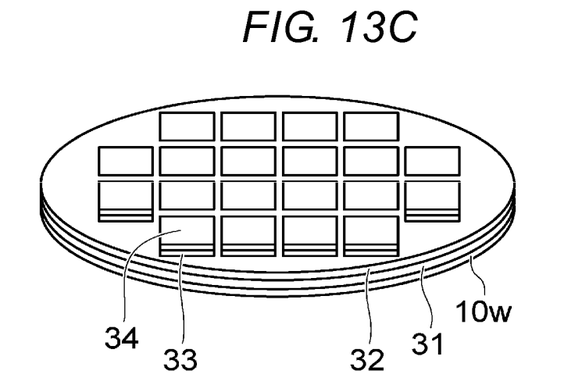

FIGS. 13A to 13C are schematic perspective views illustrating a manufacturing process of a main portion of a semiconductor device according to a second embodiment.

For example, as illustrated in FIG. 13A, the insulating layer 40 is formed on the second buffer layer 32. The insulating layer 40 comprises, for example, silicon oxide. Here, the insulating layer 40 is formed in the dicing region 10DL as well as in the peripheral region 10r. Alternatively, the insulating layer 40 may be provided not in the dicing region 10DL but only in the peripheral region 10r.

As illustrated in FIG. 13B, the channel layer 33 and the barrier layer 34 are formed on the second buffer layer 32 over the insulating layer 40 in that order.

Next, as illustrated in FIG. 13C, the insulating layer 40 and the carrier transport layer 33 and the barrier layer 34 formed on the insulating layer 40 are selectively removed according to lift-off processing using an acid solution. According to this, the channel layer 33 and the barrier layer 34 selectively remain in the chip region 10s as individual islands. In short, according to the second embodiment, it is possible to obtain a substrate in which the nitride semiconductor layer in a crystal state of good quality is formed.

Without the insulating layer 40, when the first buffer layer 31, the second buffer layer 32, the channel layer 33, and the barrier layer 34 are stacked on the substrate 10W in this order, for example, tensile strain is applied to the nitride semiconductor layer because of a difference of the coefficient of thermal expansion between the substrate 10W and the nitride semiconductor layer or a lattice mismatch of the substrate 10W and the nitride semiconductor layer.

The larger the diameter of the substrate 10W is, the larger the accumulated strain and thus the total distortion amount around the substrate in the nitride semiconductor layer. Accordingly, the substrate may warp in some cases. When the substrate is warped, stress is applied to the whole region of the nitride semiconductor layer. According to this, defect 30d occurs in the whole region of the nitride semiconductor layer when the channel layer 33 and barrier layer extend over the entire substrate. This may cause a crack or a break in the nitride semiconductor layer.

In order to cope with the above, in the second embodiment, most of the defects 30d occur in the nitride semiconductor layer on the insulating layer 40 and the nitride semiconductor layer on the insulating layer 40 are removed together with the insulating layer 40. Accordingly, the nitride semiconductor layer having suppressed defect generation is formed on the substrate 10W. When a nitride semiconductor device is formed using this method, the manufacturing yield is improved.

The pattern shape of the insulating layer 40 formed on the substrate 10W is not restricted to a lattice shape and an island shape but a dot shape, a chain shape, and a cross shape may be employed.

In the embodiment, "on" in the case of the expression of "A is provided on B" means the case where "A is in contact with B and upper than B" as well as the case where "A is not in contact with B but just upper than B". Further, the expression of "A is located on B" is also applied to the case where A is under B with A and B inverted and the case where A and B are aligned alongside. This is because even if rotating the semiconductor device according to the embodiment, the structure of a semiconductor device does not change before and after the rotation.

As mentioned above, the embodiments have been described with reference to specific examples. The embodiments are not restricted to the above examples. In other words, modifications properly made by those skilled in the art are to be included in the scope of the invention as long as they have the characteristics of the embodiment. Each element contained in each specific example as mentioned above and its position, material, condition, shape, and size are not restricted to the illustrated ones but may be properly changed.

Further, each element included in the above mentioned embodiments may be properly combined with each other as far as technically permitted and their combination is to be included in the scope of the embodiment as far as it has the characteristics of the embodiment. Other, within the spirit of the invention, various changes and modifications may be easily arrived at by those skilled in the art, and it should be noted that all such changes and modifications should be within the scope of the invention.

Further, in the specification, "nitride semiconductor" is intended to include all the semiconductors with the composition ratio of x, y, and z various within each range in the chemical formula $B_x In_y Al_z Ga_{1-x-y-z} N$ where $0 \leq x \leq 1$, $0 \leq y \leq 1$, $0 \leq z \leq 1$, $x+y+z \leq 1$. Further, in the above chemical formula, it should be noted that the compound further including the V group element other than N (nitrogen), the compound further including various doped elements in order to control the various physical property such as conductivity, and the compound further including various elements without intention may be included in "nitride semiconductor".

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a substrate;
   a first nitride semiconductor layer on the substrate;
   a second nitride semiconductor layer on the first nitride semiconductor layer;
   a third nitride semiconductor layer on the second nitride semiconductor layer;
   a first electrode on the third nitride semiconductor layer;
   an insulating layer under the electrode and between a portion of the first nitride semiconductor layer and the second nitride semiconductor layer;
   a second electrode on the third nitride semiconductor layer; and
   a third electrode,
   the first electrode comprising a first electrode portion extending in a second direction, the second direction crossing a first direction extending away from the substrate and a second electrode portion extending in a third direction crossing the first direction and the second direction, the first electrode portion electrically connected to the second electrode portion and the second electrode portion electrically connected to the third nitride semiconductor layer,
   the second electrode comprising a third electrode portion extending in the second direction and a fourth electrode portion extending in the third direction, the third electrode portion electrically connected to the fourth electrode portion, and the fourth electrode portion electrically connected to the third nitride semiconductor layer and aligned to extend in spaced relationship with the second electrode portion,
   the third electrode comprising a fifth electrode portion extending in the second direction and a sixth electrode portion extending in the third direction, the fifth electrode portion electrically connected to the sixth electrode portion and the sixth electrode portion located between the second electrode portion and the fourth electrode portion,
   wherein the insulating layer is provided at least under any of the first electrode portion, the third electrode portion, and the fifth electrode portion.

2. The device according to claim 1, wherein the insulating layer is further provided at least under any of the second electrode portion or the fourth electrode portion.

3. The device according to claim 1, wherein the insulating layer is further provided in a termination region surrounding an element region where the second electrode portion, the fourth electrode portion, and the sixth electrode portion are arranged.

4. The device according to claim 1, wherein the second nitride semiconductor layer has a higher defectivity in the region overlying an insulating layer than in a portion thereof between insulating layers.

5. The device according to claim 4, wherein the second semiconductor layer has a seam therein over an insulating layer.

6. The device according to claim 1, wherein the second nitride semiconductor layer has a higher defectivity in the region overlying an insulating layer than in a portion thereof spaced from an insulating layer.

* * * * *